US005804353A

United States Patent [19]

Cushner et al.

[11] Patent Number: 5,804,353

[45] **Date of Patent: *Sep. 8, 1998**

[54] LASERS ENGRAVABLE MULTILAYER FLEXOGRAPHIC PRINTING ELEMENT

[75] Inventors: Stephen Cushner, Lincroft; Roxy Ni Fan, East Brunswick, both of N.J.; Ernst Leberzammer, Glen Mills, Pa.; John Anthony Quinn, Morganville; Paul Thomas Shea, Freehold, both of N.J.; Carol Marie Van Zoeren, Wilmington, Del.

[73] Assignee: E. I. duPont de Nemours and Company, Wilmington, Del.

[ * ] Notice: The portion of the term of this patent subsequent to May 11, 2012, has been disclaimed.

[21] Appl. No.: 881,444

[22] Filed: May 11, 1992

[51] Int. Cl.[6] .................................................. G03F 7/00

[52] U.S. Cl. .................. 430/306; 430/270.1; 430/286.1; 430/302; 430/945; 430/327; 430/297; 101/470; 101/453

[58] Field of Search ............................ 430/270.1, 286.1, 430/306, 302, 945, 327, 297; 101/470, 453

[56] References Cited

U.S. PATENT DOCUMENTS

| | | | |
|---|---|---|---|
| 2,014,043 | 9/1935 | Harbison et al. | 101/379 |
| 3,549,733 | 12/1970 | Caddell | 264/25 |
| 3,574,657 | 4/1971 | Burnett | 430/302 |
| 3,975,761 | 8/1976 | Taudt et al. | 358/78 |
| 3,991,673 | 11/1976 | Coale et al. | 101/395 |
| 4,108,659 | 8/1978 | Dini | 96/36.3 |
| 4,156,124 | 5/1979 | Macken et al. | 219/121 L |
| 4,162,919 | 7/1979 | Richter et al. | 96/87 R |
| 4,232,345 | 11/1980 | Zollman et al. | 358/299 |
| 4,245,003 | 1/1981 | Oransky et al. | 428/323 |
| 4,248,960 | 2/1981 | Hein et al. | 430/325 |
| 4,264,705 | 4/1981 | Allen | 430/286 |
| 4,323,928 | 4/1982 | Zollman et al. | 358/299 |
| 4,347,785 | 9/1982 | Chase et al. | 101/1 |
| 4,388,865 | 6/1983 | Kellner | 101/401.1 |
| 4,390,903 | 6/1983 | Pomeroy | 358/282 |
| 4,528,909 | 7/1985 | Rigg et al. | 101/395 |
| 4,725,528 | 2/1988 | Koch et al. | 430/286 |
| 4,806,506 | 2/1989 | Gibson | 430/328 |
| 4,907,508 | 3/1990 | Patschorke | 101/401.1 |
| 4,912,824 | 4/1990 | Baran | 29/121.2 |
| 4,917,990 | 4/1990 | Herrmann | 430/286 |
| 4,940,650 | 7/1990 | Kurtz et al. | 430/286 |
| 4,947,022 | 8/1990 | Ostroff et al. | 219/121.68 |
| 4,994,344 | 2/1991 | Kurtz et al. | 430/273 |
| 5,047,116 | 9/1991 | Luthi et al. | 156/643 |
| 5,259,311 | 11/1993 | McCaughey, Jr. | 101/401.1 |
| 5,262,275 | 11/1993 | Fan | 430/273 |

FOREIGN PATENT DOCUMENTS

| | | | |
|---|---|---|---|
| 0 315 152 A2 | 10/1989 | European Pat. Off. | G03F 7/26 |
| 1 293 771 | 1/1961 | France . | |
| 2 223 984 | 4/1990 | United Kingdom . | |

OTHER PUBLICATIONS

FLEXO, pp. 6–46 (Dec. 1990). P.W. Sharkey; "Laser–Engraved Anilox Rolls".

Culkin et al., Designer's Handbook, Industrial Lasers, Parts 1 & 2, Photonics Spectra, pp. 57,58,60,62,63,69,70,72,74, 76,78,80 and 82 (Oct. 1987).

Grapholas, Product Literature from Baasel Lasertech (Circa Dec. 1988).

Euro Flexo Magazine, pp. 8–10 (Nov. 1990).

Lambdaphysik, pp. 8, 10 and 5 (Jun. 1990).

Odian, G.; *Principles of Polymerization*; 1970; pp. 194–211.

*Primary Examiner*—Rachel Gorr
*Attorney, Agent, or Firm*—Thomas H. Magee

[57] ABSTRACT

A process for making a multilayer flexographic printing plate which involves reinforcing and laser engraving a multilayer flexographic printing element.

20 Claims, No Drawings

LASERS ENGRAVABLE MULTILAYER FLEXOGRAPHIC PRINTING ELEMENT

FIELD OF THE INVENTION

This invention relates to a process for making flexographic printing plates and, in particular, to a process for making laser engraved multilayer flexographic printing plates and also of concern are laser engravable multilayer flexographic printing elements.

BACKGROUND OF THE INVENTION

Printing plates are well known for use in flexographic printing, particularly on surfaces which are corrugated or smooth, such as packaging materials, e.g., cardboard, plastic films, etc.

Typically, flexographic printing plates which have heretofore been used are those made from vulcanized rubber. Rubber was favored because it could be used with harsh solvents, it had good ink transfer, high elasticity, and high compressibility. Rubber elements were made by vulcanizing the rubber in a suitable mold.

More recently, it has been possible to laser engrave a rubber element directly. Laser engraving has provided a wide variety of opportunities to rubber printing plates. Highly concentrated and controllable energy lasers can engrave very fine details in rubber. The relief of the printing plate can be varied in many ways. Very steep as well as gently decreasing relief slopes can be engraved so as to influence the dot gain of such plates.

Commercial rubbers can be natural or synthetic. An example of a synthetic rubber includes ethylene-propylene-diene monomer elastomers (EPDM) which can be used to make a laser engravable flexographic printing element. Elements made from natural or synthetic rubbers require vulcanization with sulfur, a sulfur containing moiety, or peroxide to effect chemical crosslinking. Such crosslinked materials will hereinafter be referred to as "rubber". In addition, such vulcanized elements require grinding to obtain uniform thickness and a smooth surface suitable for printing. This is extremely time consuming and labor intensive.

It has been found that it is possible to make a laser engraved single layer, flexographic printing plate by a process which comprises:

(a) reinforcing an elastomeric layer situated on top of a flexible support to produce a laser engravable flexographic printing element which optionally has a removable coversheet situated on top of the elastomeric layer, said reinforcement being selected from the group consisting of mechanical, photochemical and thermochemical, or a combination thereof provided that thermochemical reinforcement is accomplished using a crosslinker other than sulfur, a sulfur-containing moiety, or peroxide; and (b) laser engraving the laser engravable element of step (a) with at least one preselected pattern to produce a laser engraved flexographic printing plate provided that the coversheet is removed prior to laser engraving if a coversheet is present to produce a viable flexographic printing plate, as is described in Applicants' assignee's U.S. Ser. No. 07/880,792, Attorney docket number IM-0753, being co-filed simultaneously herewith.

U.S. Pat. No. 3,549,733, issued to Caddell on Dec. 22, 1970, describes a method for producing polymeric printing plates. The printing plate is made by exposing a layer of the polymeric material to a controlled laser beam of sufficient intensity to ablate the polymer and form depressions in the surface.

SUMMARY OF THE INVENTION

This invention relates to a process for making a multilayer, flexographic printing plate which comprises:

(a) reinforcing i) at least one elastomeric intermediate layer situated on top of a flexible support and ii) an elastomeric top layer situated on top of the intermediate layer to produce a laser engravable flexographic printing element which optionally has a removable coversheet wherein the composition of the top layer is different from the composition of the intermediate layer, wherein the reinforcement is selected from the group consisting of mechanical, photochemical and thermochemical reinforcement, or a combination thereof, provided that thermochemical reinforcement is accomplished using a crosslinker other than sulfur, a sulfur containing moiety, or peroxide; and (b) laser engraving the laser engravable element of step (a) with at least one preselected pattern to produce a laser engraved flexographic printing plate provided that the coversheet is removed prior to laser engraving if a coversheet is present.

In a second embodiment, this invention relates to a process for making a multilayer, flexographic printing plate which comprises:

(a) reinforcing an elastomeric top layer situated on top of an elastomeric intermediate layer situated on top of a flexible support to produce a laser engravable flexographic printing element which optionally has a removable coversheet wherein the reinforcement of the top layer is selected from the group consisting of mechanical, photochemical and thermochemical reinforcement, or a combination thereof provided that thermochemical reinforcement is accomplished using a crosslinker other than sulfur, a sulfur containing moiety, or peroxide; and (b) laser engraving the top layer of the laser engravable element of step (a) with at least one preselected pattern to produce a laser engraved flexographic printing plate provided that the coversheet is removed prior to laser engraving if a coversheet is present.

In a third embodiment, this invention relates to a multilayer, laser engravable flexographic printing element which comprises:

(a) a flexible support;

(b) at least one laser engravable, reinforced elastomeric intermediate layer; and (c) a laser engravable, reinforced elastomeric top layer situated on top of layer (b) wherein the composition of layer (c) is different from the composition of layer (b) and wherein layers (b) and (c) have been singly reinforced mechanically or thermochemically, or multiply reinforced mechanically and photochemically, mechanically and thermochemically, photochemically and thermochemically, or mechanically, photochemically, and thermochemically, provided that thermochemical reinforcement is accomplished using a crosslinker other than sulfur, a sulfur containing moiety or peroxide and further wherein the reinforcement of layers (b) and (c) can be the same or different.

In a fourth embodiment, this invention relates to a multilayer, laser engravable flexographic printing element which comprises:

(a) a flexible support;

(b) an elastomeric intermediate layer; and (c) a laser engravable, reinforced elastomeric top layer situated on top of layer (b) wherein the top layer is singly reinforced mechanically or thermochemically or multiply reinforced mechanically and photochemically, mechanically and thermochemically, photochemically and thermochemically, or mechanically, photochemically, and thermochemically, provided that thermochemical reinforcement is accomplished using a crosslinker other than sulfur, a sulfur containing moiety or peroxide.

In a fifth embodiment, this invention relates to a multilayer, laser engravable flexographic printing element which comprises:

(a) a flexible support;

(b) at least one laser engravable, reinforced elastomeric intermediate layer; and (c) a laser engravable, reinforced elastomeric top layer situated on top of layer (b) wherein the composition of layer (c) is different from the composition of layer (b) and wherein layers (b) and (c) comprise at least one thermoplastic elastomer, said layers being singly reinforced mechanically or thermochemically, or multiply reinforced mechanically and photochemically, mechanically and thermochemically, photochemically and thermochemically, or mechanically, photochemically and thermochemically and further wherein the reinforcement of layers (b) and (c) can be the same or different.

In a sixth embodiment, this invention relates to a multilayer, laser engravable flexographic printing element which comprises:

(a) a flexible support;

(b) an elastomeric intermediate layer; and (c) a laser engravable, reinforced elastomeric top layer situated on top of layer (b) wherein said top layer comprises at least one thermoplastic elastomer, said top layer being singly reinforced mechanically or thermochemically or multiply reinforced mechanically and photochemically, mechanically and thermochemically, photochemically and thermochemically, or mechanically, photochemically and thermochemically.

DETAILED DESCRIPTION OF THE INVENTION

Lasers can develop sufficient power densities to ablate certain materials. Lasers such as high-power carbon dioxide lasers can ablate many materials such as wood, plastic and rubber. Once the output from a laser is focused at a particular point on a substrate with a suitable power density, it is possible to remove material in depth from an organic solid to create a relief. Areas not struck by the laser beam are not removed. Thus, the use of the laser offers the potential of producing very intricate engravings in the proper material.

The term "laser engravable" as used herein refers to reinforced materials capable of absorbing laser radiation such that those areas of the materials which are exposed to a laser beam of sufficient intensity become physically detached with sufficient resolution and relief depth to be suitable for flexographic applications. It will be understood that if the laser radiation is not absorbed by the reinforced material directly, then it may be necessary to add a laser radiation absorbing component as described below. By "physically detached", it is meant that the material so exposed is either removed or is capable of being removed by any mechanical means such as vacuum cleaning or washing or by directing a stream of gas across the surface to remove the loosened particles.

Surprisingly and unexpectedly, it has been found that by reinforcing and laser engraving a multilayer flexographic printing element a viable flexographic printing plate can be produced. This was surprising and unexpected because these elements do not possess the toughness of conventional rubber printing elements. It was expected that such non-rubber printing elements would melt too much during the laser engraving process and, thus, produce poor quality and low resolution images on the plate. Accordingly, the process and elements of the instant invention provide an alternative to laser engravable rubber flexographic printing elements which results in printing plates with the high image resolution required for the packaging industry.

The process and multilayer laser engravable flexographic printing elements utilize elastomeric materials which do not require tedious vulcanization and grinding steps in order to achieve uniform thickness. Multilayer flexographic elements of uniform thickness can be prepared by a variety of methods such as extrusion and calendering, lamination, molding, spraying, or dip coating. In addition, no treatment with noxious sulfur or sulfur-containing crosslinkers is required.

These elastomeric materials can be used to particular advantage in the formation of seamless, continuous printing elements. The flat sheet elements can be reprocessed by wrapping the element around a cylindrical form, usually a printing sleeve or the printing cylinder itself, and fusing the edges together to form a seamless, continuous element. Such fusion is not possible with rubber plates because the vulcanized rubber is irreversibly crosslinked and, thus, cannot dissolve or melt unless the network structure is destroyed.

Continuous printing elements have applications in the flexographic printing of continuous designs such as in wallpaper, decoration and gift wrapping paper. Furthermore, such continuous printing elements are well-suited for mounting on conventional laser engraving equipment. The sleeve or cylinder on which the printing element is wrapped when the edges are fused, can be mounted directly into the laser engraving apparatus where it functions as the rotating drum during the engraving process.

Unless otherwise indicated, the term "multilayer, flexographic printing plate or element" encompasses plates or elements in any form suitable for flexographic printing, including, but not limited to, flat sheets and seamless continuous forms.

Another advantage in working with the process and multilayer, laser engravable flexographic printing elements of the invention is that the noxious odors associated with conventional rubber plates are minimized during laser engraving.

An advantage of the multilayer elements of the invention is that they possess dimensional stability due to the presence of a flexible support.

The process and elements of the invention utilize elastomeric materials which can be reinforced using at least one type of reinforcement selected from the group consisting of mechanical, photochemical and thermochemical reinforcement, or a combination thereof, provided that thermochemical reinforcement is accomplished using a crosslinker other than sulfur, a sulfur containing moiety or peroxide, to produce an elastomeric layer suitable for laser engraving as is described below. Such reinforcement is very important in utilizing the process and multilayer, laser engravable flexographic printing elements of the invention.

The process of the invention for making a multilayer, flexographic printing plate comprises (a) reinforcing (i) at least one elastomeric intermediate layer situated on top of a flexible support and (ii) an elastomeric top layer situated on top of the intermediate layer to produce a flexographic printing element which optionally has a removable coversheet wherein the composition of the top layer is different from the composition of the intermediate layer, wherein the reinforcement is selected from the group consisting of mechanical, photochemical and thermochemical reinforcement, or a combination thereof, provided that thermochemical reinforcement is accomplished using a crosslinker other than sulfur, a sulfur containing moiety, or peroxide and further wherein the reinforcement of the top layer and the intermediate layer can be the same or different; and (b) laser engraving the laser engravable element of step (a) with at least one preselected pattern to produce a laser engraved flexographic printing plate provided that the coversheet is removed prior to laser engraving if a coversheet is present.

In another embodiment the process of the invention for making a multilayer, flexographic printing plate comprises (a) reinforcing an elastomeric top layer situated on top of an elastomeric intermediate layer situated on top of a flexible support to produce a laser engravable flexographic printing element which optionally can have a coversheet situated on top of the elastomeric layer wherein the reinforcement of the top layer is selected from the group consisting of mechanical, photochemical and thermochemical reinforcement, or a combination thereof, provided that thermochemical reinforcement is accomplished using a crosslinker other than sulfur, a sulfur containing moiety, or peroxide; and (b) laser engraving the top layer of the laser engravable element of step (a) with at least one preselected pattern to produce a laser engraved flexographic printing plate that the coversheet is removed prior to laser engraving if a coversheet is present.

The top layer should have good laser engraving characteristics and the desired printing characteristics including ink transferability, solvent resistance, and ozone resistance. At the same time, the intermediate layer can be formulated to have good laser engraving characteristics and to provide the desired bulk properties including Shore A hardness and resilience. In addition, the top layer should be compatible with the intermediate layer in that it should remain affixed to that layer and have similar flexibility.

Those skilled in the art will appreciate that in order to maximize the advantages obtained with respect to such a multilayer structure, each layer will have a different composition, i.e., the top layer will have a different composition from the intermediate layer.

In general, the top layer comprises an elastomeric material which is singly or multiply reinforced mechanically and/or photochemically and/or thermochemically provided that thermochemical reinforcement is accomplished using a crosslinker other than sulfur, a sulfur-containing moiety, or peroxide. In addition, the reinforcement of the top layer can be the same as or different from the reinforcement of the intermediate layer.

Either a single elastomeric material or a combination of materials can be used provided that the top layer has the desired characteristics. It is also preferred, but not essential, that such materials do not incorporate halogens or heteroatoms such as sulfur, so as to avoid any toxic gases being emitted during the laser engraving process.

Examples of elastomeric materials suitable for making the top layer are described in *Plastics Technology Handbook*, Chandler et al., Ed., (1987), the disclosure of which is hereby incorporated by reference. This includes, but is not limited to, elastomeric materials such as copolymers of butadiene and styrene, copolymers of isoprene and styrene, styrene-diene-styrene triblock copolymers, etc. Certain of these block copolymers have been described in U.S. Pat. Nos. 4,323,636, 4,430,417 and 4,045,231, the disclosures of which are hereby incorporated by reference. These triblock copolymers can be divided into three basic types of polymers: polystyrene-polybutadiene-polystyrene (SBS), polystyrene-polyisoprene-polystyrene (SIS), or polystyrene-poly(ethylenebutylene)-polystyrene (SEBS).

There can also be mentioned non-crosslinked polybutadiene and polyisoprene; nitrile elastomers; polychloroprene; polyisobutylene and other butyl elastomers; chlorosulfonated polyethylene; polysulfide; polyalkylene oxides; polyphosphazenes; elastomeric polymers and copolymers of acrylates and methacrylates; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives. The term elastomer, as used herein, encompasses core shell microgels and blends of microgels and preformed macromolecular polymers, such as those disclosed in Fryd et al., U.S. Pat. No. 4,956,252, and U.S. Pat. No. 5,075,192 the disclosures of which are hereby incorporated by reference.

In many cases, it may be desirable to use thermoplastic elastomers to formulate either layer of the multilayer structure and, preferably, the top layer. When a thermoplastic elastomer layer is singly reinforced mechanically, it remains thermoplastic. However, when a thermoplastic elastomeric layer is reinforced photochemically or thermochemically, either singly or in combination with other types of reinforcement, then the layer remains elastomeric but is no longer thermoplastic after such reinforcement.

Mechanical reinforcement of elastomeric layers whether thermoplastic or non-thermoplastic can be accomplished by incorporating materials called reinforcing agents. Such materials enhance mechanical properties of elastomeric materials like tensile strength, stiffness, tear resistance, and abrasion resistance.

In order to be considered as a mechanical reinforcing agent in the process and elements of the present invention, an additive must modify the elastomeric material such that it can be laser engraved to produce a flexographic printing plate, irrespective of the effect of the additive on other mechanical properties. It will be understood that the additives which can be used as reinforcing agents will vary depending on the composition of the elastomeric material. Thus, materials which are reinforcing agents in one elastomer, may not function as reinforcing agents in another elastomer.

The reinforcing agent is, generally, a particulate material, although not all materials can serve as a reinforcing agent. Selection of a suitable reinforcing agent depends on the elastomeric material. Examples of such agents can include, but are not limited to, finely divided particles of carbon black, silica, $TiO_2$, calcium carbonate and calcium silicate, barium sulfate, graphite, mica, aluminum, and alumina.

Increasing the amount of reinforcing agent causes a concomitant improvement in the laser engravability and the mechanical properties of the elastomer until a maximum is reached which represents the optimum loading for a particular composition. Beyond this point, the properties of the elastomeric material will deteriorate.

The effectiveness of the reinforcing agent also depends on the particle size and the tendency of the material to agglomerate or form chains. In general, tensile strength, abrasion and tear resistance, hardness and toughness increase with decreasing particle size. When carbon black is used as the reinforcing agent, the particle size is usually between 200 and 500 Å in diameter. For other reinforcing agents, particle sizes up to a few micrometers in diameter can be used. Reinforcing agents which tend to form agglomerates or chains are more difficult to disperse in the elastomer and result in materials having higher stiffness and hardness, but low tensile strength and toughness.

Photochemical reinforcement is accomplished by incorporating photohardenable materials into the elastomeric layer and exposing the layer to actinic radiation. Photohardenable materials are well known and include photocrosslinkable or photopolymerizable systems, or combinations thereof. Photocrosslinking generally occurs by crosslinking a preformed polymer to form a substantially insoluble crosslinked polymeric network. This can occur either through dimerization of pendant reactive groups attached directly to the polymer chain, or reaction of the polymer with a separate polyfunctional photoactive crosslinking agent. Photopolymerization generally occurs when relatively low molecular weight monomers or oligomers undergo photoinitiated cationic or free radical polymerization to form substantially insoluble polymers. In some systems, both photocrosslinking and photopolymerization can occur.

Photohardenable materials which can be incorporated on elastomer generally comprise a photoinitiator or photoinitiator system (hereinafter referred to as "photoinitiator system") and one of (i) a low molecular weight monomer or oligomer capable of undergoing polymerization, (ii) reactive groups pendant to the elastomer which are capable of reacting with each other or (iii) reactive groups pendant to the elastomer and a crosslinking agent capable of reacting with the reactive groups.

The photoinitiator system is one which, upon irradiation with actinic radiation, forms a species which will initiate either free radical or cationic crosslinking or polymerization reactions. By actinic radiation, it is meant high energy radiation including but not limited to UV, visible, electron beam, and X-ray. Most photoinitiator systems for free radical reactions in current use are based upon one of two mechanisms: photofragmentation and photoinduced hydrogen abstraction. Suitable photoinitiator systems of the first type include peroxides, such as benzoyl peroxide; azo compounds, such as 2,2'-azobis(butyronitrile); benzoin derivatives, such as benzoin and benzoin methyl ether; derivatives of acetophenone, such as 2,2-dimethoxy-2-phenylacetophenone; ketoxime esters of benzoin; triazines; and biimidazoles. Suitable photoinitiator systems of the second type include anthraquinone and a hydrogen donor; benzophenone and tertiary amines; Michler's ketone alone and with benzophenone; thioxanthones; and 3-ketocoumarins.

Photoinitiator systems suitable for cationic crosslinking or polymerization reactions are those which, upon irradiation, produce a Lewis acid or a protonic Bronsted acid which is capable of initiating polymerization of ethylene oxide or epoxy derivatives. Most photoinitiator systems of this type are onium salts, such as diazonium, iodonium and sulfonium salts.

Sensitizing agents can also be included with the photoinitiator systems discussed above. In general, sensitizing agents are those materials which absorb radiation at a wavelength different than that of the reaction-initiating component, and are capable of transferring the absorbed energy to that component. Thus, the wavelength of the activating radiation can be adjusted.

As mentioned above, the elastomer can have pendant groups which are capable of undergoing free-radical induced or cationic crosslinking reactions. Pendant groups which are capable of undergoing free-radical induced crosslinking reactions are generally those which contain sites of ethylenic unsaturation, such as mono- and polyunsaturated alkyl groups; acrylic and methacrylic acids and esters. In some cases, the pendant crosslinking group can itself be photosensitive, as is the case with pendant cinnamoyl or N-alkyl stilbazolium groups. Pendant groups which are capable of undergoing cationic crosslinking reactions include substituted and unsubstituted epoxide and aziridine groups.

Monomers undergoing free-radical polymerization are typically ethylenically unsaturated compounds. Examples of which include acrylate and methacrylate esters of alcohols and their low molecular weight oligomers. Examples of suitable monomers and oligomers with two or more sites of unsaturation capable of undergoing free-radical induced addition reactions, include the polyacrylate and polymethacrylate esters of polyols such as triethyleneglycol, trimethylolpropane, 1,6-hexanediol, and pentaerythritol, and their low molecular weight oligomers. Esters of ethoxylated trimethyolol propane, in which each hydroxyl group has been reacted with several molecules of ethylene oxide, as well as monomers derived from bisphenol A diglycidyl ether and monomers derived from urethanes have also been used. Monomers which undergo cationic polymerization include mono- and polyfunctional epoxides and aziridines. In some cases, where there are residual reactive sites in the binder, e.g., residual unsaturation or epoxide groups, the crosslinking agent can also react with the binder.

If the top layer is very thin and the intermediate layer is reinforced by photohardening with a monomer or oligomer, it is possible to photoharden the top layer without formulating that layer with a monomer, reactive groups, or a photoinitiating system. This is accomplished by applying the top layer, comprising at least one elastomer, to the intermediate layer before it is photohardened, with moderate heat and/or pressure. The top layer becomes photosensitive in this step due to the migration of the mobile monomers or oligomers from layer (b) to layer (c), the top layer. When the intermediate layer is photohardened due to exposure to actinic radiation, the top layer will be photohardened. Those skilled in the art will appreciate that a majority of, but not all, monomers and oligomers have sufficient mobility to migrate as discussed above. Therefore, this factor should be taken into consideration when formulating the top and intermediate layers. In general, top layers having a thickness of about 5 mils (0.013 cm) or less can be reinforced by hardening in this manner.

Examples of photocrosslinkable and photopolymerizable systems have been discussed in detail in several references, e.g., A. Reiser in *Photoreactive Polymers* (John Wiley & Sons, New York 1989), J. Kosar in *Light-Sensitive Systems* (John Wiley & Sons, New York 1965), Chen et al., U.S. Pat. No. 4,323,637, Gruetzmacher et al., U.S. Pat. No. 4,427,759 and Feinberg et al., U.S. Pat. No. 4,894,315, the disclosures of which are hereby incorporated by reference.

Thermochemical reinforcement is accomplished by incorporating materials, which undergo hardening reactions when exposed to heat, into the elastomer. One type of thermochemically hardenable material is analogous to the photochemically hardenable material described above, and comprises a thermal initiator system and a monomer or oligomer which can undergo free-radical addition reactions. The thermal initiator system generally employs an organic peroxide or hydroperoxide, such as benzoyl peroxide. Suitable monomers and oligomers include the monofunctional and polyfunctional compounds described above in connection with the photohardenable systems. Strictly speaking, many of these monomers undergo polymerization and crosslinking reactions when heated even in the absence of thermal initiator systems. However, such reactions are less controllable, and it is generally preferred to include a thermal initiator system.

If the top layer is very thin and the intermediate layer is reinforced by thermally hardening with a monomer or oligomer, it is possible to thermally harden the top layer without formulating that layer with a monomer, reactive groups or a thermal initiator system. This is accomplished by applying the top layer, comprising at least one elastomer, to the intermediate layer before it is thermally hardened, with moderate heat and/or pressure. The top layer becomes hardenable in this step due to the migration of the mobile monomers or oligomers and the mobility of such monomers or oligomers should be considered as discussed above with respect to photochemical reinforcement. When the intermediate layer is heated resulting in thermochemical reinforcement, the top layer will also be reinforced. In general, top layers having a thickness of about 5 mils (0.013 cm) or less can be reinforced by hardening in this manner.

A second type of thermochemically hardenable material comprises a thermosetting resin, optionally with a catalyst such as a Lewis acid or base. Furthermore, the heating step must take place at a temperature which does not deleteriously affect the elastomer. Types of thermosetting resins which can be used include phenol-formaldehyde resins such as novolacs and resoles; urea-formaldehyde and melamine-formaldehyde resins; saturated and unsaturated polyester resins; epoxy resins; urethane resins; and alkyd resins. Such resins, and suitable catalysts for them, are well known in the art.

In a third type of thermochemically hardenable material the elastomer has reactive pendant groups which, when heated, (i) react with each other to form crosslinked networks or (ii) react with a crosslinking agent. Both type (i) and type (ii) can optionally contain a catalyst. Examples of types of reactive groups which can be used, both pendant to the elastomer and in a separate crosslinking agent, include amino and acid or acid anhydride groups which react to form amide linkages; alcohol and acid or acid anhydride groups which react to form ester linkages; isocyanate and alcohol groups which react to form urethane linkages; dianhydride and amino groups which react to form an imide linkage; acid and epoxy or aziridine groups; etc. Thermochemical reinforcement as described herein does not involve using a crosslinker such as sulfur, a sulfur-containing moiety or a peroxide. However, it will be understood that peroxides can be used as a photo- or thermal initiator as described above.

The top layer can contain one or more laser radiation absorbing components which will be discussed in more detail below. Other additives can include plasticizers, antioxidants, adhesion promoters, rheology modifiers, antiozonants, dyes and colorants, and non-reinforcing fillers.

In order to provide the desired durability and printing characteristics, the top layer will, in general, be harder than the intermediate layer. This hardness can be accomplished in a variety of ways. For example, the amount of reinforcing agent or other filler can be increased or a harder elastomer can be chosen. In addition, the hardness can be accomplished by adding an additional polymeric material to the elastomer. This additional polymeric material can be elastomeric or nonelastomeric and is one which is harder than the elastomer. That is, a layer consisting of the elastomer and the additional polymer will have a higher Shore A hardness than a layer consisting of the elastomer alone. The materials which can be used as the additional polymer will depend on the nature of the elastomer in the layer. Some polymers which can be used effectively as the additional polymer include, but are not limited to, acrylonitrile/butadiene copolymers; acrylonitrile/butadiene/styrene copolymers; methyl methacrylate (or methyl acrylate)/acrylonitrile/butadiene/styrene copolymers; the previous types of copolymers in which the butadiene is replaced with isoprene; carboxylated acrylonitrile polymers; styrene copolymers with isoprene or butadiene; and acrylate and methacrylate polymers and copolymers. In addition, mixtures of more than one of these polymeric materials can be added.

In some cases it is desirable to use an additional polymer in the top layer which is incompatible with the elastomer in that layer. By "incompatible" it is meant that a mixture or blend of the elastomer and additional polymer does not form a single homogeneous phase, but rather, the additional polymer is present as discrete islands or domains within the elastomer. This can be due to true chemical incompatibility between the elastomer and additional polymer, solubility differences, methods of preparation, mixing conditions, etc. In some cases, small particles of the additional polymer may protrude on the surface of the top layer to create a matte effect. This can result in improved printing characteristics in the laser engraved flexographic printing plate.

The additional polymeric material generally comprises from 0 to about 65% by weight based on the total weight of the top layer. The weight ratio of the elastomer to the additional polymer is generally in the range of 20:1 to 1:2.

A preferred composition for the top layer is a photochemically or thermochemically reinforced elastomer which is the photoinitiated or thermally initiated reaction product of (i) at least one elastomer, (ii) at least one additional polymer as described above, (iii) at least one monomer or oligomer and (iv) a photoinitiator or thermal initiator system wherein the weight ratio of the elastomer to the additional polymer is from 20:1 to 1:2.

A particularly preferred composition for the top layer is the photoinitiated or thermally initiated reaction product of 60 to 100 parts by weight of a styrene-diene-styrene block copolymer, 20 to 50 parts by weight of an additional polymer selected from the group consisting of acrylonitrile/butadiene/styrene copolymers, methyl methacrylate/acrylonitrile/butadiene/styrene copolymers and mixtures thereof, 5 to 20 parts by weight of an ethylenically unsaturated monomer, 1 to 10 parts by weight of a photoinitiator or thermal initiator system, and 0.05 to 30 parts by weight of a laser radiation absorbing component.

In another embodiment, the top layer can be formulated with at least one elastomer and at least one additional polymer and still be photochemically and/or thermochemically reinforceable provided that the intermediate layer is formulated to include at least one mobile monomer or oligomer and a photoinitiator and/or thermal initiator system. As discussed above, the top layer becomes photohardenable and/or thermally hardenable due to migration of at least one mobile monomer or oligomer from the intermediate layer to the top layer.

The top layer can range in thickness from about 0.1 to 50 mils (0.00025 to 0.13 cm), and is preferably 0.5 to 25 mils (0.0013 to 0.063 cm).

The composition of layer (b), i.e., the intermediate layer, should be chosen to provide the final flexographic printing plate with the necessary and desired bulk properties. Thus, it should provide flexibility, low Shore A hardness and resilience. In addition, the intermediate layer should be compatible with the top layer as discussed above.

In general, the intermediate layer can be constructed in one of two ways. One way involves using a reinforced elastomeric material which is capable of being laser engraved. Such intermediate layers are generally used with relatively thin top layers and are engraved with the top layer in the laser engraving step. A second construction involves using an elastomeric material which may or may not be reinforced and which is not intended to be laser engraved. This second type of intermediate layer is used with relatively thick top layers and is not engraved in the laser engraving step. Thus, it functions more as a cushion layer, providing the necessary bulk properties without being a part of the relief image.

The first type of intermediate layer, i.e., a laser engravable reinforced elastomeric layer, generally comprises an elastomer which is reinforced mechanically, photochemically, thermochemically or a combination thereof, provided that thermochemical reinforcement is accomplished using a crosslinker other than sulfur, a sulfur-containing moiety or peroxide. The type of reinforcement of the intermediate layer can be the same as or different than the reinforcement of the top layer. However, the composition of the intermediate layer will be different from the composition of the top layer.

Examples of suitable elastomers to formulate the intermediate layer include those listed above for the top layer. The mechanical, photochemical and thermochemical reinforcing materials can also be selected from the materials discussed above. The intermediate layer can contain one or more laser radiation absorbing components and also include other additives such as plasticizers, antioxidants, adhesion promoters, rheology modifiers, antiozonants, dyes and colorants, and non-reinforcing fillers. The intermediate layer will generally have a lower Shore A hardness and greater resilience than the top layer.

The thickness of the laser engravable intermediate layer will generally range from 20 to 250 mils (0.051 to 0.51 cm) depending on the desired thickness of the total element.

The second type of intermediate layer is a cushion layer, i.e., one which provides the bulk flexibility and resilience for the element, but which is not laser engraved. Examples of materials that are suitable for this type of intermediate layer include elastomeric materials, elastomeric foams such as crosslinked urethane foams, and natural and synthetic rubbers.

The thickness of the intermediate cushion layer will generally range from 20 to 230 mils (0.051 to 0.46 cm) depending on the desired thickness of the total element.

It will be appreciated that more than one intermediate layer can be present in the printing elements of the invention. To achieve special printing properties, intermediate layers with different hardnesses and based on different formulations can be added.

In some cases, the elastomeric material can be multiply reinforced such as by mechanical reinforcement and additionally by photochemical or thermochemical reinforcement or by both photochemical and thermochemical reinforcement. It may even be desirable to use mechanical, photochemical and thermochemical reinforcement.

In another embodiment, this invention concerns a multilayer, laser engravable flexographic printing element which comprises (a) a flexible support;

(b) at least one laser engravable, reinforced elastomeric intermediate layer; and (c) a laser engravable, reinforced elastomeric top layer situated on top of layer (b) wherein the composition of layer (c) is different from the composition of layer (b) and wherein layers (b) and (c) have been singly reinforced mechanically or thermochemically, or multiply reinforced mechanically and photochemically, mechanically and thermochemically, photochemically and thermochemically, or mechanically, photochemically, and thermochemically, provided that thermochemical reinforcement is accomplished using a crosslinker other than sulfur, a sulfur containing moiety or peroxide and further wherein the reinforcement of layers (b) and (c) can be the same or different.

In another embodiment, this invention concerns a multilayer, laser engravable flexographic printing element which comprises (a) a flexible support;

(b) an elastomeric intermediate layer; and (c) a laser engravable, reinforced elastomeric top layer situated on top of layer (b) wherein the top layer is singly reinforced mechanically or thermochemically or multiply reinforced mechanically and photochemically, mechanically and thermochemically, photochemically and thermochemically, or mechanically, photochemically, and thermochemically, provided that thermochemical reinforcement is accomplished using a crosslinker other than sulfur, a sulfur containing moiety or peroxide.

In still another embodiment, this invention concerns a multilayer, laser engravable flexographic printing element which comprises (a) a flexible support;

(b) at least one laser engravable, reinforced elastomeric intermediate layer; and (c) a laser engravable, reinforced elastomeric top layer situated on top of layer (b) wherein the composition of layer (c) is different from the composition of layer (b) and wherein layers (b) and (c) comprise at least one thermoplastic elastomer, said layers being singly reinforced mechanically or thermochemically, or multiply reinforced mechanically and photochemically, mechanically and thermochemically, photochemically and thermochemically, or mechanically, photochemically and thermochemically and further wherein the reinforcement of layers (b) and (c) can be the same or different.

In a further embodiment, this invention concerns a multilayer, laser engravable flexographic printing element which comprises (a) a flexible support;

(b) an elastomeric intermediate layer; and (c) a laser engravable, reinforced elastomeric top layer situated on top of layer (b) wherein said top layer comprises at least one thermoplastic elastomer, said top layer being singly reinforced mechanically or thermochemically or multiply reinforced mechanically and photochemically, mechanically and thermochemically, photochemically and thermochemically, or mechanically, photochemically and thermochemically.

An advantage in working with the preferred elements of the invention is that because they can be formulated from thermoplastic elastomeric materials they allow for an efficient production of elements of uniform thickness by extruding and calendering. Thus, a significant cost savings can be realized through a much simpler manufacturing process, one which does not include tedious, time-consuming vulcanization and grinding.

When the intermediate layer in the multilayer element is a cushion layer as described above, the relief pattern will be formed only in the top layer, i.e., it is the top layer which is laser engraved. When the intermediate layer is a reinforced elastomeric layer as described above, the laser can engrave both the top layer and the intermediate layer.

Laser engraving involves the absorption of laser radiation, localized heating and removal of material in three dimensions and is an extremely complex process. The laser engraving of at least one preselected pattern into a reinforced multilayer element is quite complex.

The pattern can be one which results in the printing of a single image. The same image can be engraved on the printing element more than once, in a so-called "step-and-repeat" procedure. The element can also be engraved with two or more different patterns to print two or more separate and different images or to create a composite image. The pattern itself can be, for example, in the form of dots or linework generated by a computer, in a form obtained by scanning the artwork, in the form of a digitized image taken from original artwork, or a combination of any of these forms which can be electronically combined on a computer prior to laser engraving.

An advantage associated with the laser engraving process is an ability to utilize information in digital form. The image to be printed can be converted into digital information which is used to modulate the laser during the engraving process. The digital information can even be transmitted from a distant location. Corrections can be made easily and quickly by adjusting the digitized image.

The laser engraving process of the invention does not involve the use of a mask or stencil. This is because the laser impinges the sample to be engraved at or near its focus spot. Thus, the smallest feature that can be engraved is dictated by the laser beam itself. The laser beam and the material to be engraved are in constant motion with respect to each other, such that each minute area of the plate ("pixel") is individually addressed by the laser. The image information is fed into this type of system directly from the computer as digital data, rather than via a stencil.

Factors to be considered when laser engraving include, but are not limited to, deposition of energy into the depth of the element, thermal dissipation, melting, vaporization, thermally induced chemical reactions such as oxidation, presence of air-borne material over the surface of the element being engraved, and mechanical ejection of material from the element being engraved. Investigative efforts with respect to engraving of metals and ceramic materials with a focused laser beam have demonstrated that engraving efficiency (the volume of material removed per unit of laser energy) and precision are strongly intertwined with the characteristics of the material to be engraved and the conditions under which laser engraving will occur.

Similar complexities come into play when engraving elastomeric materials even though such materials are quite different from metals and ceramic materials.

Laser engravable materials usually exhibit some sort of intensity threshold, below which no material will be removed. Below the threshold it appears that laser energy deposited into the material is dissipated before the vaporization temperature of the material is reached. This threshold can be quite high for metals and ceramic materials. However, with respect to elastomeric materials it can be quite low. Above this threshold, the rate of energy input competes quite well with opposing energy loss mechanisms such as thermal dissipation. The dissipated energy near, though not in, the illuminated area may be sufficient to vaporize the material and, thus, the engraved features become wider and deeper. This effect is more pronounced with materials having low melting temperatures.

When laser engraving at higher intensities, material can become ionized which means that it has been excited well beyond the threshold needed to laser engrave. In addition, significant amounts of air-borne substances can be quickly generated over the surface which can impede the radiation from reaching the surface of the material. Examples of such substances which can form a high absorbing "cloud" or even a plasma of ionized particles include vapor, ash, ions, etc.

One basic parameter which must be considered is the choice of laser. Some lasers such as a carbon dioxide laser or the infrared-emitting solid state lasers operate in continuous-wave (CW) and pulsed mode. Another type of laser is the excimer laser which produces (10–15 nsec) high-average, peak power (100–150 megawatts) pulses in the ultraviolet portion of the spectrum (approximately 200–300 nm) and can be operated only in the pulsed mode. Ablation of polymeric materials by excimer laser is commonly used to create patterned relief features for microelectronics, for example. In that case, the excimer beam is relatively large, and is passed through an image-bearing stencil or mask. An excimer could be focused to a single spot. However, the maximum modulation rate of an excimer laser is only on the order of a few kHz. This limits the rate at which each pixel may be engraved, leading to long access times to a whole plate. This access time limitation renders the excimer inappropriate for commercial use in this application. Still another laser that can be used is a semiconductor diode laser which can be operated in either CW or pulsed mode. Such lasers have considerably lower power output compared to the lasers discussed above. However, because the laser engravable flexographic elements described herein have such a low threshold to engraving, even these diode lasers can be used. At the present time, the lasers which have commercial significance for engraving flexographic printing elements are the $CO_2$ laser and the infrared-emitting solid state lasers, e.g., the Nd:YAG laser.

Significant differences have been observed between engraving in a CW mode versus a pulsed mode. One possible explanation is due to thermal dissipation. When engraving in a CW mode, material has a "thermal history" so that to the temporal and spatial extent of thermal dissipation, engraving effects are cumulative. In contrast, thermal dissipation in the pulsed mode results in a minimal thermal history due to the time interval between pulses.

Consequently, at low or moderate radiation intensities, pulsed engraving may be less efficient. Energy which might heat, even melt the material, but not vaporize it or otherwise cause it to become physically detached is lost. On the other hand, CW irradiation at low or moderate intensities is accumulated in a given area while the beam scans the vicinity of that area. Thus, at low intensities, CW may be the preferred mode. Pulsed mode may be the preferred mode at high intensities because if a cloud of radiation absorbing material were formed, there would be time for it to dissipate in the time interval between pulses and, thus, it would permit a more efficient delivery of radiation to the solid surface.

Those skilled in the art will appreciate that as the pulse repetition period approaches the thermal dissipation time or the time for the plasma to dissipate, the material integrates the input energy over that time and the pulsed engraving mode may become indistinguishable from CW mode.

Engraving of nonmetals is a thermally induced process in which the energy of a focused beam of light is absorbed by the host material. Since a laser beam represents energy in the form of light, it is important that the material that is to be laser engraved has the capability of transforming the light energy into thermal energy via an absorption mechanism.

Carbon dioxide lasers operate around an approximately ten (10) micrometer wavelength whereas infrared emitting solid state lasers, such as the Nd:YAG laser, operate around an approximately one (1) micrometer wavelength.

Generally, elastomers themselves are capable of absorbing radiation around ten (10) micrometers and, thus, do not require an additional laser radiation absorbing component in order to engrave with a carbon dioxide laser. However, it may be desirable to use such a laser radiation absorbing component.

In contrast, elastomers are generally not capable of absorbing radiation around one (1) micrometer and, thus, usually require at least one component capable of absorbing the light energy generated by a near infrared emitting solid state laser, i.e., a laser radiation absorbing component, in order to be engraved at that wavelength.

Absorptivity of the material has a number of effects, one of which is an impact on the engraving result by affecting the penetration depth of the radiation, i.e., the depth to which energy is deposited. When significant radiation penetrates well below the surface, vaporized material can be effectively trapped and will not become physically detached. Energy absorbed below the surface will be dissipated either thermally or mechanically into the bulk of the material. By mechanically it is meant that there can be sudden expansion of subsurface material leading to deformation throughout the bulk and at the surface. Image quality and print characteristics of the resulting printing plate are compromised. Similarly, high intensity can also deposit energy well below the surface to create such problems.

One possibility is that the relief is not achieved by instant excitation throughout the bulk followed by expulsion of material from the bulk. Rather, it appears that a more “steady state” process is involved wherein radiation is absorbed at the surface which causes the surface material to become physically detached by melting, vaporizing, and/or oxidizing. A new recessed surface of molten material is revealed which absorbs radiation and is ejected. Thus, absorptivity affects the thickness of this receding “skin depth” as well as the spatial extent of thermal excitation below this “skin” and into the bulk.

Examples of laser radiation absorbing components suitable to increase absorptivity of a material for a near-infrared red emitting solid state laser include infrared absorbing dyes and pigments. These components can be used alone or in combination with other radiation absorbing components and/or other constituents depending upon the objectives to be achieved as is discussed below. Suitable dyes which can be used alone or in combination include poly(substituted) phthalocyanine compounds and metal-containing phthalocyanine compounds; cyanine dyes; squarylium dyes; chalcogenopyryloarylidene dyes; croconium dyes; metal thiolate dyes; bis(chalcogenopyrylo)polymethine dyes; oxyindolizine dyes; bis(aminoaryl)polymethine dyes; merocyanine dyes; and quinoid dyes. Finely divided particles of metals such as aluminum, copper or zinc can also be used either alone or in combination with other radiation absorbing components. Suitable pigments which can be used alone or in combination include carbon black, graphite, copper chromite, chromium oxides, cobalt chrome aluminate, and other dark inorganic pigments. A preferred pigment is carbon black.

It will be noted that some laser radiation absorbing components can also serve as reinforcing agents in mechanically reinforced elastomeric layers. Carbon black is particularly preferred in this dual function. In addition, some laser radiation absorbing components such as carbon black, the dark inorganic pigments and finely divided metal particles can also serve as a thermal agent, affecting the heat capacity, thermal diffusion and other characteristics of the material which significantly impact the engraving efficiency, relief depth, and image quality.

The preferred laser radiation absorbing component for all lasers (carbon dioxide, near infrared emitting solid state, diode or excimer) is carbon black.

Thus, those skilled in the art will appreciate that if a laser radiation absorbing component or components are needed, then the amount of such component or components used should be determined taking into account the variety of ways in which this component or components can impact the engraving process and the resulting printing plate.

The base or support for the printing element should be flexible and adhere well to the intermediate layer. In addition, the base or support adds dimensional stability to the element.

Suitable base or support materials include metals, e.g., steel and aluminum plates, sheets and foils, and films or plates composed of various film-forming synthetic resins or high polymers such as the addition polymers and in particular vinylidene chloride copolymers with vinyl chloride, vinyl acetate, styrene, isobutylene and acrylonitrile; linear condensation polymers such as polyesters, e.g., polyethylene terephthalate, polycarbonate, polyamide, e.g., polyhexamethylene-sebacamide; polyimides, e.g., films as disclosed in Applicants' assignee's U.S. Pat. No. 3,179,634 and polyester amide. Non-reinforcing fillers or reinforcing agents can be present in the synthetic resin or polymer bases such as the various fibers (synthetic modified or natural), e.g., cellulosic fibers, for instance, cotton, cellulose acetate, viscose rayon, paper; glass wool; nylon and polyethylene terephthalate. These reinforced bases can be used in laminated form. In addition, the base can be subbed or surface treated to improve adhesion.

A transparent coversheet such as a thin film of polyester, polycarbonate, polyamide, fluoropolymers, polystyrene, polyethylene, polypropylene or other strippable material can be used to prevent contamination or damage to the surface of the top layer and is removed prior to laser engraving. The coversheet can also be subbed with a release layer. In addition, the coversheet can have a pattern and, thus, impart that pattern to the surface of the top layer.

Multilayer, laser engravable flexographic printing elements described herein can be optionally treated to remove surface tackiness either before or after laser engraving. Suitable treatments which have been used to remove surface tackiness of styrene-diene block copolymers include treatment with bromine or chlorine solutions as described in Gruetzmacher et al., U.S. Pat. No. 4,400,459 and Fickes et al., U.S. Pat. No. 4,400,460; and light finishing, i.e., exposure to radiation sources having a wavelength not longer than 300 nm, as described in Gibson, U.S. Pat. No. 4,806,506, and European Patent EP 0 17 927, the disclosures of which are hereby incorporated by reference. It should be clear to those skilled in the art that such surface treatment does not constitute a photochemical or thermochemical reinforcement of the bulk layer.

In addition, these elements can be subjected to post-laser engraving treatments such as overall exposure to actinic radiation, heating or a combination thereof. Exposure to actinic radiation and/or heat is generally intended to complete the chemical hardening process. This is particularly true for the floor and sidewall surfaces which are created by laser engraving. It may be particularly advantageous to include a post-laser engraving treatment for photochemically reinforced plates.

The individual layers of the multilayer, laser engravable flexographic elements of the invention can be prepared employing a variety of techniques which are well known in the art. As was noted above, the multilayer elements of the invention can have a single intermediate layer or can have more than one intermediate layer. When reference is made to "the intermediate layer" it encompasses both single and multiple layers. One method which can be used, is to mix the components of a layer in an extruder, particularly a twin-screw extruder, and then extrude the mixture onto a support. To achieve uniform thickness the extrusion step can be advantageously coupled with a calendering step in which the hot mixture is calendered between two flat sheets or between one flat sheet and a release roll. In the case of the intermediate layer, it can be extruded/calendered directly onto the final support. The top layer can be extruded/calendered directly onto a coversheet. Alternatively, either layer can be extruded/calendered onto a temporary support and later laminated to the appropriate material. It will be understood that for layers which are to be reinforced by a thermochemical hardening reaction, the temperature of the extrusion and calendering steps must be significantly lower than the temperature required to initiate the hardening reaction.

The layers can also be prepared by compounding the components in a suitable mixing device, e.g., a Banbury mixer, and then pressing the material into the desired shape in a suitable mold. The intermediate layer is generally pressed between the support and a second temporary support; the top layer between the coversheet and a second temporary support. Alternatively, either layer can be pressed between two temporary supports, followed by lamination onto the final desired material. The molding step can involve pressure and/or heat. As with the process above, it will be understood that for layers which are to be reinforced by a thermochemical hardening reaction, the temperature of the molding step must be significantly lower that the temperature required to initiate the thermochemical hardening reaction.

An alternative method, is to dissolve and/or disperse the components of a layer in a suitable solvent and coat the mixture onto the support (for the intermediate layer), a coversheet (for the top layer) or a temporary support. The material can be coated as one layer or as a multiplicity of layers having the same composition. It is also possible to spray on a single or multiple coating of the intermediate layer and/or a single or multiple coatings of the top layer. It will be understood that the choice of solvent for coating or spraying will depend on the exact composition of the layer. Solvent coating or spraying may be preferred for layers which are to be thermochemically hardened.

As discussed above, the intermediate layer can be mechanically reinforced, photochemically reinforced, thermochemically reinforced, or a combination thereof or it can be a cushion layer which is not to be laser engraved. The top layer can be mechanically reinforced, photochemically reinforced, thermochemically reinforced or a combination thereof. Any of the types of intermediate layers can be used with any of the types of top layers resulting in a large number of combinations with varying properties and requiring different methods of preparation for the final printing element.

The layers can be prepared separately by any of the methods discussed above, and then laminated together. In some cases, one or both of the layers will have sufficient tackiness so that the layers remain firmly adhered together. In some cases it is necessary to add a thin adhesive layer in order to obtain adequate adhesion. The two layers should remain firmly bonded throughout the preparation of the multilayer element and the printing process. In general, an adhesion of at least 2 pli (0.35 N/mm) is sufficient. It should be noted that, if the layers are laminated prior to photochemical and/or thermochemical hardening, the adhesion after the hardening step(s) must be considered when deciding whether an adhesive layer is necessary. Adhesives for elastomeric materials are well known in the art. Examples of a variety of suitable adhesives can be found in the *Handbook of Adhesives*, second edition, I. Skeist, ed. (Van Nostrand Reinhold Co., Inc., New York 1977).

The layers also can be prepared sequentially on the final support or a temporary support, in extrusion/calendering, molding, coating or spraying steps, or combinations of these. As discussed above, it may also be necessary to add an adhesive between the layers.

A preferred process for making the multilayer element involves both solvent coating and extrusion/calendering. The top layer is first solvent coated onto a coversheet. The intermediate layer is then extruded and calendered between the support and the coversheet coated with the top layer, such that the top layer is adjacent to the intermediate layer.

Another process is to form the intermediate layer on the support by any of the processes discussed above and then to wrap it around a cylindrical form and fuse the edges to form a seamless continuous intermediate layer. The surface of this continuous intermediate layer is then sprayed with a solvent coating of the top layer to form a seamless continuous multilayer printing element.

For elements in which the top layer is mechanically reinforced and the intermediate layer is either mechanically reinforced or a cushion layer, the element is complete and ready for laser engraving after the layers have been combined. Optionally, the surface of the element can be detackified prior to laser engraving as discussed above.

For elements in which at least one of the layers is photochemically reinforced, that layer should be exposed overall to actinic radiation to effect photohardening in depth either before or after combination with the other layer, but prior to laser engraving. Overall exposure is important to effect photochemical reinforcement of the elastomeric layer. The source of the radiation must be chosen so that the wavelength emitted matches the sensitive range for the photoinitiator system. Typically, photoinitiator systems are sensitive to ultraviolet radiation. The radiation source then should furnish an effective amount of this radiation, preferably having a wavelength range between about 250 nm and 500 nm. In addition to sunlight, suitable high energy radiation sources include carbon arcs, mercury-vapor arcs, fluorescent lamps, electron flash units, electron beam units and photographic flood lamps. Mercury-vapor lamps, UV fluorescent tubes and sun lamps are suitable. Lasers can be used if the intensity is sufficient only to initiate photohardening and not to ablate material. The exposure time will vary depending upon the intensity and spectral energy distribution of the radiation, its distance from the photosensitive material, and the nature and amount of the photosensitive composition. If only the top layer is photohardenable, the exposure step can be conveniently carried out after the layers are combined. If the intermediate layer is photohardenable, the exposure step for that layer can be carried out prior to combining the layers or after the combination but preferably after the combination. After the layers are combined, the exposure of the intermediate layer can be carried out either through the top layer or through the support or through both sides simultaneously, provided that the support is transparent to the activating radiation. A removable coversheet can be present during the exposure step provided that it is removed after exposure and prior to laser engraving.

For elements in which at least one of the layers is thermochemically reinforced, that layer should be heated either before or after combination with the other layer, but prior to laser engraving to effect thermochemical reinforcement. If one layer is thermochemically reinforced and one layer is photochemically reinforced, it is generally advantageous to combine the layers first, expose to actinic radiation to photoharden and then heat to thermally harden, although other procedures can be used. The temperature of the heating step should be sufficient to thermochemically reinforce the elastomeric material and will depend on the nature of the thermal initiator and/or the reacting groups in the elastomeric material. As discussed above, the temperature should be adequate to effect thermochemical reinforcement without degrading the elastomeric material in the thermochemically hardenable layer or the materials in the other layer if the layers have been combined. Heating can be accomplished using any conventional heating means, e.g., an oven, microwave, or IR lamp. The heating time will vary depending upon the temperature and the nature and amount of the thermally sensitive composition. A removable coversheet can be present during the heating step, so long as it can still be removed after heating and prior to laser engraving.

For elements in which both photochemical and thermochemical reinforcement are used, the element is both exposed to actinic radiation and heated to effect the reinforcement. The exposure and heating steps can be carried out in any order, including simultaneous heating and exposure.

In some cases, it may be desirable to prepare individual layers in the element by applying a multiplicity of thinner layers having the same composition. This can be particularly advantageous for layers which are reinforced photochemically. After the application of each thin layer the material can be exposed to actinic radiation to effect photochemical hardening of that thin layer. When laser radiation absorbing components and/or mechanical reinforcing agents have high optical density with respect to actinic radiation or act as inhibitors, e.g., carbon black, are present in the layer, this may be desirable in order to effect photohardening throughout the bulk. The inherent tackiness of the non-photohardened material is generally sufficient to insure that all of the thin layers remain firmly affixed together.

The top layer can be further treated to create a matte surface if this is desired for the laser engraved flexographic printing plate. The matte surface can be created by a variety of techniques which are well known, e.g., lamination to a patterned coversheet, embossing, surface etching with chemicals or lasers, the addition of small particles to the layer which protrude on the surface, etc.

EXAMPLES

Glossary of Abbreviations

HMDA=1,6-Hexanediol diacrylate

MABS=Tetrapolymer of methyl methacrylate/acrylonitrile/butadiene/styrene; Blendex® 491 from General Electric Co., Parkersburg, W. Va.

BHT=Butyrated hydroxytoluene

EPD=Ethyl-p-dimethylaminobenzoate

Initiator I=2-Phenyl-2,2-dimethoxy acetophenone

Initiator II=2-Isopropylthioxanthone

Nisso Oil=Liquid 1,2-polybutadiene; Nisso BP-1000 from Nippon Soda Co., Ltd., Tokyo, Japan Polyoil=Liquid 1,4-polybutadiene, MW=3000; Polyoil 110/130 from Nuodex, Inc., Piscataway, N.J.

Laser Engraving in Pulsed Mode

Samples were engraved in a pulsed mode on a test apparatus which consisted of a pulsed Nd:YAG laser, Spectra-Physics DCR-11 (Spectra-Physics Corp., Mountain View, Calif.), and a computer-controlled X-Z translation stage (Daedal Co., Harrison City, Pa.). The laser was operated in the long pulse mode, approximately 200 microsecond pulse duration, at 10 Hz repetition rate. The laser beam was focused with a 40 mm focal length lens, and impinged the sample held on the translation stage via vacuum. The X direction velocity of the stage was chosen so that translation during the laser repetition period of 100 milliseconds gave a suitable distance between individual laser pulses as shown below. Between successive horizontal (X direction) lines, the laser was shuttered and the translation stage was moved up (Z direction) by a predetermined distance. This gave a two dimensional pattern with relief depth.

The test conditions were as follows:

Test Pattern 1 laser pulse energy=5 mJ

X direction spacing=33 micrometers

Z direction spacing=350 micrometers

Test Pattern 2 laser pulse energy=5 mJ

X direction spacing=33 micrometers

Z direction spacing=50 micrometers

Test pattern 1 resulted in the formation of parallel channels in the sample. These were then profiled for shape and size using a Dektak 3030 profilometer (Veeco Instruments Inc., Santa Barbara, Calif.). These data supplied information regarding the image quality potential of the sample material.

Test pattern 2 resulted in the formation of a rectilinear cavity in the sample. The volume of this cavity was measured. The volume and the total laser energy delivered were used to calculate the average engraving efficiency as follows:

$$\text{Average engraving efficiency} = \frac{\text{cavity volume}}{\text{total energy}}\ \text{cm}^3/\text{kW} - \text{hr}$$

Laser Engraving in Continuous Wave Mode to form Flexographic Printing Plates

Sample materials were engraved on a commercial laser engraving apparatus equipped with either a $CO_2$ or a Nd:YAG laser. In each case, the sample was mounted on the exterior of a rotating drum. For the $CO_2$ laser apparatus, the laser beam was directed parallel to the axis of the drum, and was directed toward the sample surface with a folding mirror mounted on a translation lead screw. For the Nd:YAG laser, the folding mirror was stationary and the drum moved parallel to its axis. The laser beam was then focused to impinge on the sample mounted on the drum. As the drum rotated and translated relative to the laser beam, the sample was exposed in a spiral fashion. The laser beam was modulated with image data, i.e., dots, lines and text characters with or without support structures, resulting in a two dimensional image with relief engraved into the sample material.

The relief depth was measured as the difference between the thickness of the floor and the thickness of the printing layer. The average engraving efficiency was also calculated.

Single Mode Versus Multimode Laser Beams

The Nd:YAG laser used for pulsed engraving tests gave a multimode beam. The Nd:YAG and $CO_2$ lasers used for CW tests were operated in either multi- or single-mode. For these, single mode was achieved either by introducing an intracavity aperture or by replacing the cavity rear reflector and output coupler. In single mode, the lasers gave somewhat less total output power. However, the single mode beam can be focused more tightly than the multimode beam, so that the intensity (Watts per unit area) is not significantly different in the two cases. Because of melting and flow of molten material in and around irradiated region, the shape of engraved features was similar for either single- or multi-mode. The major difference between these, then, was simply that the focus and therefore heat affected region is somewhat smaller in single mode, resulting in somewhat improved image quality.

Printing

Printing tests were carried out with the engraved plates on a Mark Andy press System 830 (Chesterfield, Mo.) using Film III Dense Black EC8630 ink (Environmental Inks & Coatings, Morganton, N.C.) diluted with EIC Aqua Refresh EC1296 to a viscosity of 20 seconds as measured using a Zahn #2 cup. Printing was done on Hi Gloss 40FS S246 paper (Fasson, Painesville, Ohio). All samples were run at optimum impression as judged by the operator at 120 feet per minute. The plates were evaluated by determining the finest reverse line width, the highlight dot size and the halftone scale printed.

EXAMPLES 1–6

These examples illustrate multilayer laser-engravable elements of the invention in which the top layer is photochemically and mechanically reinforced, and the intermediate layer is mechanically reinforced.

EXAMPLES 1–4

A laser-engravable mechanically reinforced thermoplastic elastomeric intermediate layer was prepared from S-I-S (a styrene-isoprene-styrene block copolymer, Kraton® 1107, Shell Chemical Co., Houston, Tex.) which was precompounded with carbon black to a level of 10 phr in a Moiyama batch mixer. This blended mixture was fed into a 30 mm twin screw extruder and extruded at 182° C. between a polyethylene terephthalate support and a polyethylene terephthalate temporary protective sheet coated with a silicone release layer. Both the support and the temporary protective sheet had a thickness of 5 mil (0.013 cm). The total thickness of the layer, except for the protective sheet, was 104 mils (0.26 cm). The intermediate layer had a Shore A hardness of 32.3, as measured using a Zwick durometer, and a resilience of 42.3%, as measured with a Zwick 5109 rebounded resilience tester.

The elastomer for the photosensitive top layer was prepared by precompounding a thermoplastic elastomeric binder with carbon black in a Moriyama batch mixer.

In Example 1 the elastomer was S-B-S (a styrene-butadiene-styrene block copolymer, Kraton® 1102, Shell Chemical Co., Houston, Tex.) with 10 phr carbon.

In Examples 2 and 3 the elastomer was S-B-S with 50 phr carbon.

In Example 4 the elastomer was a copolymer of ethylene/n-butyl acrylate/carbon monoxide (Elvaloy® HP, E. I. du Pont de Nemours and Company, Wilmington, Del.) with 12.5% by weight carbon.

The compositions of the photosensitive top layers are given in Table 1 below.

TABLE 1

| | Example | | | |
|---|---|---|---|---|
| Component | 1 | 2 | 3 | 4 |
| HMDA | 10 | 10 | 10 | 10 |
| MABS | 19 | 28 | 28 | 28 |
| Elastomer | 38 | 56 | 56 | 56 |
| BHT | 1 | 1 | 1 | 1 |
| Initiator I | 5 | 5 | — | 5 |
| Initiator II | — | — | 0.5 | — |
| EPD | — | — | 4.5 | — |
| Nisso Oil | 20.1 | — | — | — |
| Polyoil | 6.9 | — | — | — |
| Final % C | 3.45 | 18.7 | 18.7 | 6.6 |

The components for each example were dispersed and dissolved in methylene chloride and doctor knife coated onto a 5 mil thick (0.013 cm) sheet of polyethylene terephthalate (coversheet). After drying, each photosensitive layer was tacky to the touch.

The photosensitive layers had a thickness of about 0.9 to 1.0 mil (0.0023 to 0.0025 cm).

The temporary protective sheet was removed from several samples of the thermoplastic elastomeric intermediate layer prepared above and each of the photosensitive top layers described above was laminated to an intermediate layer at room temperature with contact pressure using a Cromalin® laminator (E. I. du Pont de Nemours and Company, Wilmington, Del.) with a rigid copper piece as a carrier. The resulting multilayer elements had the following layers, in order: polyester support, thermoplastic elastomeric intermediate layer, photosensitive top layer, polyester coversheet.

Each multilayer photosensitive element from above was overall exposed to UV radiation through the polyester coversheet for 20 minutes using a Cyrel® 30×40 exposure unit (E. I. du Pont de Nemours and Company, Wilmington, Del.) to photochemically reinforce the photosensitive top layer resulting in a laser-engravable multilayer element. The coversheet was then removed. The photochemically reinforced top layer was no longer tacky. The adhesion between the two layers was excellent and there was no crack formation upon bending the element.

The properties of the elements and the results of the pulsed laser engraving tests with the Nd:YAG laser are given in Table 2 below. The results of the continuous wave laser engraving with both $CO_2$ and Nd:YAG lasers and printing tests are given in Table 3.

TABLE 2

| Ex. | Shore A | Resilience % | % C[a] | OD[b] | Width[c] | Depth[c] | Engraving Efficiency[d] |
|---|---|---|---|---|---|---|---|
| 1 | 32.3 | 42.3 | 3.45 | 2.54 | 6.4 | 2.2 | 444 |
| 2 | 39 | 46 | 18.7 | 5.64 | 7.0 | 3.0 | 459 |
| 3 | 39 | 46 | 18.7 | 5.64 | 8.2 | 2.4 | 457 |
| 4 | 34.7 | 46.2 | 6.6 | 4.24 | 7.8 | 2.0 | 382 |

[a]% carbon black in the total composition
[b]optical density
[c]in mils (0.00254 cm)
[d]in $cm^3$/kW-hr

TABLE 3

| Ex. | Laser[a] | Power | Speed[b] | Relief Depth[c] | Line Width[d] | Half-tone Scale[e] |
|---|---|---|---|---|---|---|
| 1 | YAG[g] | 30 W | 70 | 9 | 15 R | 5–98% |
| 1 | YAG[g] | 30 W | 50 | 12 | 16.2 R | 5–98% |
| 1 | YAG[g] | 30 W | 30 | 20 | 17.4 R | 5–98% |
| 1 | YAG | 9 W | 150 | 2.3 | 4.6 I | 2–95% |
| 1 | YAG[h] | 9 W | 50 | 6 | — | 2–95% |
| 1 | $CO_2$ | 300 W | 240[f] | 10.7 | — | 2–90% |
| 2 | YAG[h] | 9 W | 150 | 2.7 | 4.4 I | 2–95% |

[a]YAG = Nd:YAG laser
$CO_2$ = $CO_2$ laser in single mode with an advance rate of 35 micrometers
[b]Engraving speed in rpm
[c]in mils
[d]Width of a 7 mil reverse (R) or isolated (I) line, in mils
[e]Printing results with 85 lines per inch screen
[f]Speed in meters/minute
[g]multi-mode
[h]single mode; advance rate of 25 micrometers

EXAMPLE 5

This example illustrates the need for a laser radiation absorbing component (carbon black) in a photochemically reinforced top layer of a multilayer laser-engravable printing element having an the elastomeric component which does not itself absorb laser radiation.

Elements were prepared as described in Example 1, except that the elastomer for the photosensitive top layer was 38 parts of a combination of S-B-S with 10 phr carbon and S-B-S with no carbon to lower the total carbon content. The final carbon content of the top layer and the pulsed engraving results with the Nd:YAG laser are given in Table 4 below.

TABLE 4

| Ex. | Shore A | Resil-ience % | % C[a] | Width[c] | Depth[c] | Engrav-ing Effi-ciency[d] |
|---|---|---|---|---|---|---|
| 5 | 33.7 | 46.4 | 1 | 6 | 2.8 | 462 |
| 5 | 34.3 | 46.1 | 0.2 | 8.8 | 2.4 | 305 |
| 5 | — | — | 0.05 | [e] | [e] | [e] |

[a]% carbon black in the total composition
[b]optical density
[c]in mils (0.00254 cm)
[d]in $cm^3$/kW-hr
[e]The sample could not be laser engraved with the Nd:YAG laser.

EXAMPLE 6

The mechanically reinforced elastomeric intermediate layer was S-I-S which was precompounded with (1) carbon black to a level of 1 phr and (2) $TiO_2$ to a level of 50 phr, as reinforcing agents. The top photochemically reinforced layer was the same as described in Example 1. The multilayer laser-engravable printing element was prepared and treated using the procedure of Example 1.

The multilayer element had a Shore A hardness of 36.3 and a resilience of 45.2%.

The results of the pulsed engraving tests with the Nd:YAG laser showed that the multilayer printing element could be laser engraved with the formation of channels having sharp shoulders with a width of 7.7 mils (0.020 cm) and a depth of 1.7 mils (0.0043 cm). The average engraving efficiency was 136 $cm^3$/kW-hr.

EXAMPLE 7

This example illustrates a multilayer laser-engravable element of the invention in which the top layer is a mechanically reinforced elastomeric layer and the intermediate layer is an elastomeric layer photochemically reinforced layer.

The intermediate layer was made from the following photochemically reinforced composition:

| Component | Amount (g) |
|---|---|
| S-B-S | 58.2 |
| S-I-S with 10 phr carbon black | 2.5 |
| HMDA | 10 |
| Initiator I | 2 |
| BHT | 1 |
| Red dye | 0.006 |
| HEMA | 0.234 |
| Polyoil | 14.65 |
| Nisso Oil | 13.85 |

The mixture was milled in a hot milling device with 120 g methylene chloride at 150° C. for 15 minutes. The milled mixture was hot pressed between a 5 mil (0.013 cm) flame treated polyethylene terephthalate support and a temporary protective sheet of 5 mil (0.013 cm) polyethylene terephthalate which had been coated with a silicone release layer, to form a 30 mil (0.076 cm) intermediate layer. The final carbon content was 0.2%.

A mechanically reinforced top layer was prepared by mixing the following:

| Component | Amount (g) |
|---|---|
| Methylene chloride | 283 |
| MABS | 16.5 |
| S-B-S | 27.5 |
| S-B-S with 10 phr carbon black | 5.5 |
| BHT | 0.5 |

The above methylene chloride solution was doctor knife coated onto a 5 mil thick (0.013 cm) sheet of polyethylene terephthalate precoated with a silicone release layer. The final thickness was 0.9 mil (0.0023 cm), the carbon content was 1% and the optical density was 0.75.

The temporary protective sheet was removed from the intermediate layer and the top layer was laminated to the intermediate layer at 60° with contact pressure using the Cromalin® laminator. The multilayer structure was overall exposed through both the top and the bottom for 10 minutes in the Cyrel® exposure unit to photochemically reinforce the intermediate layer.

After removing the coversheet from the top layer, engraving tests were carried out with a pulsed laser as described in Tests 1 and 2, except using a 25 mJ laser pulse energy. The samples were engraved through to the bottom. The results were as follows:

channel width=16 mil
channel depth=2 mil
engraving efficiency=69 $cm^3$/kW-hr

EXAMPLES 8 and 9

These examples illustrate multilayer laser-engravable elements of the invention in which both the top layer and the intermediate layer are elastomeric layers which are photochemically reinforced.

EXAMPLE 8

A commercially available multilayer photosensitive flexographic printing element was used to prepare a multilayer laser engravable printing element of the invention.

A photosensitive printing element (Cyrel® 107 PLX from E. I. du Pont de Nemours and Co., Wilmington, Del.) had the following layers in the order listed: a support, two elastomeric photosensitive layers, a polyamide release layer and a coversheet. The photosensitive element was given an exposure through the support for 50 seconds on the Cyrel® exposure unit. The coversheet was removed and the structure was then given an overall exposure through the release layer in the same exposure unit for 12 minutes. The polyamide release layer was then removed by washing the exposed structure for 5 minutes in a Cyrel® 30×40 rotary processor using perchloroethylene/n-butanol (75/25 volume percent). The elements were dried in an oven at 60° C. for one hour and then detackified by light finishing for 8 minutes in a Du Pont Cyrel® Light Finish/Post Exposure unit (E. I. du Pont de Nemours and Co., Wilmington, Del.).

The multilayer laser-engravable printing element prepared above was laser engraved using a continuous wave $CO_2$ laser operating in single mode to form a relief structure in which the images had supported structure as designed by the software. The best results were obtained using a laser power of 500 W and an engraving speed of 280 m/minute with a 0.035 mm/revolution advance rate. Some waxy deposits were formed around the edges of the image areas and these were wiped away with a pad soaked in perchloroethylene/n-butanol.

On the plate, 2–90% targets were resolved with an 85 lines/inch screen. The printing results showed that a 2–90% tonal range could be printed. It was noted, however, that the size of the features engraved was dependent on the engraving direction.

EXAMPLE 9

An intermediate layer was prepared as described in Example 7. A top layer was prepared as described in Example 5. The two layers were laminated together as described in Example 7. The photosensitive structure was exposed from both sides in the Cyrel® exposure unit for 10 minutes.

Engraving tests were carried out as described in Example 7. The results were as follows:

channel width=11 mil channel depth=1.3 mil engraving efficiency=68 $cm^3$/kW-hr

EXAMPLES 10A and 10B

This example illustrates a multilayer laser-engravable element of the invention in which both the top layer and the intermediate layer are mechanically reinforced elastomeric layers.

A mechanically reinforced intermediate layer was prepared as described in Example 1.

The composition for the mechanically reinforced top layer is given below:

| | Amount (g) | |
|---|---|---|
| Component | Ex. 10-A | Ex. 10-B |
| S-B-S with 10 phr carbon | 33 | 16.6 |
| MABS | 16.5 | 33 |
| BHT | 0.5 | 0.5 |
| Final % C | 6.06 | 3.03 |

The components for each example were dispersed and dissolved in methylene chloride as a 15% solution and then doctor knife coated onto a 5 mil thick (0.013 cm) sheet of polyethylene terephthalate.

The top layer and the intermediate layer were then laminated together as described in Example 1. The element was allowed to stand for 24 hours before removing the coversheet for laser engraving.

After removing the coversheet, the samples were laser engraved as described in the screening tests. The results were as follows:

| | Ex. 10-A | Ex. 10-B |
|---|---|---|
| channel width | 11.8 mil | 10.3 mil |
| channel depth | 1.4 mil | 1.4 mil |
| engraving efficiency | 502 $cm^3$/kW-hr | 300 $cm^3$/kW-hr |

It was noted that wrinkles formed in the top layer of Example 10-B when the element was flexed or bent and also after laser engraving. This illustrates the need to have similar flexibility and hardness in the top layer and the intermediate layer. If the difference in hardness is too great, as in Example 10-B where the top layer was much harder than the intermediate layer, wrinkling can occur.

EXAMPLE 11

Example 10A was repeated using as the intermediate layer S-B-S compounded with carbon black to a level of 10 phr. The results were as follows:

channel width=6.6 mil channel depth=1.88 mil engraving efficiency=346 $cm^3$/kW-hr

EXAMPLE 12

An intermediate cushion layer was prepared from S-B-S (Example 12A) or S-I-S (Example 12B). The thermoplastic elastomer was hot pressed between a 5 mil (0.013 cm) flame treated polyethylene terephthalate support and a 5 mil (0.013 cm) polyethylene terephthalate coversheet which had been precoated with a silicone release layer, to form a 30 mil (0.076 cm) cushion layer.

The top layer had the following composition:

| Component | Amount (g) |
|---|---|
| S-B-S | 58.2 |
| S-I-S with 10 phr carbon black | 2.5 |
| HMDA | 10 |
| Initiator I | 1.2 |
| BHT | 1 |
| Red dye | 0.006 |
| HEMA | 0.234 |
| Polyoil | 14.65 |
| Nisso Oil | 13.85 |

The mixture was milled in a hot milling device with 120 g methylene chloride at 150° C. for 15 minutes. The milled mixture was hot pressed between a 5 mil (0.013 cm) flame treated polyethylene terephthalate support and a temporary protective sheet of 5 mil (0.013 cm) polyethylene terephthalate which had been coated with a silicone release layer, to form a 30 mil (0.076 cm) top layer. The final carbon content was 0.2%.

The top layer and the intermediate cushion layer were laminated together and overall exposed to UV radiation as described in Example 7.

After removal of the coversheet, the samples were laser engraved as described in Example 7. The results were as follows:

| | Ex. 12-A | Ex. 12-B |
|---|---|---|
| channel width | 13 mil | 13 mil |
| channel depth | 2.4 mil | 3 mil |
| engraving efficiency | 82 $cm^3$/kW-hr | 87 $cm^3$/kW-hr |

What is claimed is:

1. A laser engravable, multilayer flexographic printing element which comprises:

(a) a flexible support;

(b) at least one laser engravable, reinforced elastomeric intermediate layer; and (c) a laser engravable, reinforced elastomeric top layer situated on top of layer (b) wherein the composition of layer (c) is different from the composition of layer (b) and wherein layers (b) and (c) have been singly reinforced mechanically or thermochemically, or multiply reinforced mechanically and photochemically, mechanically and thermochemically, photochemically and thermochemically, or mechanically, photochemically and thermochemically, provided that thermochemical reinforcement is accomplished using a crosslinker other than sulfur, a sulfur containing moiety or peroxide and further wherein the reinforcement of layers (b) and (c) can be the same or different.

2. A laser engravable, multilayer flexographic printing element which comprises:

(a) a flexible support;

(b) an elastomeric intermediate layer; and (c) a laser engravable, reinforced elastomeric top layer situated on top of layer (b) wherein the top layer is singly reinforced mechanically or thermochemically or multiply reinforced mechanically and photochemically, mechanically and thermochemically, photochemically and thermochemically, or mechanically, photochemically, and thermochemically, provided that thermochemical reinforcement is accomplished using a crosslinker other than sulfur, a sulfur containing moiety or peroxide.

3. An element according to claims 1 or 2 which further comprises (d) a removable coversheet.

4. An element according to claims 1 or 2 wherein at least one laser radiation absorbing component is added.

5. An element according to claim 4 where in the laser radiation absorbing component is carbon black.

6. An element according to claims 1 or 2 wherein said element can be surface detackified either before or after laser engraving.

7. An element according to claims 1 or 2 wherein the reinforced top layer comprises (i) at least one elastomer and (ii) at least one additional polymer wherein the weight ratio of the elastomer to the additional polymer is from 20:1 to 1:2.

8. An element according to claim 7 wherein the top layer comprises the photoinitiated or thermally initiated reaction product of (i) at least one elastomer, (ii) at least one additional polymer, (iii) at least one monomer or oligomer and (iv) a photoinitiator or thermal initiator system wherein the weight ratio of the elastomer to the additional polymer is from 20:1 to 1:2.

9. An element according to claim 1 wherein the intermediate layer comprises the photoinitiated or thermally initiated reaction product of at least one elastomer, at least one monomer or oligomer, a photoinitiator or thermal initiator system, and the top layer comprises at least one elastomer and at least one additional polymer, wherein the ratio of the elastomer in the top layer to additional polymer in the top layer is in the range from 20:1 to 1:2, said top layer being photohardenable or thermally hardenable due to migration of at least one mobile monomer or oligomer from the intermediate layer to the top layer.

10. An element according to claim 9 wherein the additional polymer is selected from the group consisting of acrylonitrile/butadiene/styrene copolymers, methyl methacrylate/acrylonitrile/butadiene/styrene copolymers, methyl acrylate/acrylonitrile/butadiene/styrene copolymers, and mixtures thereof.

11. A laser engravable, multilayer flexographic printing element which comprises:

(a) a flexible support;

(b) at least one laser engravable, reinforced elastomeric intermediate layer; and (c) a laser engravable, reinforced elastomeric top layer situated on top of layer (b) wherein the composition of layer (c) is different from the composition of layer (b) and wherein layers (b) and (c) comprise at least one thermoplastic elastomer, said layers being singly reinforced mechanically or thermochemically, or multiply reinforced mechanically and photochemically, mechanically and thermochemically, photochemically and thermochemically, or mechanically, photochemically and thermochemically and further wherein the reinforcement of layers (b) and (c) can be the same or different.

12. A laser engravable, multilayer laser engravable flexographic printing element which comprises:

(a) a flexible support;

(b) an elastomeric intermediate layer; and (c) a laser engravable, reinforced elastomeric top layer situated on top of layer (b) wherein said top layer comprises at least one thermoplastic elastomer, said top layer being singly reinforced mechanically or thermochemically or multiply reinforced mechanically and photochemically, mechanically and thermochemically, photochemically and thermochemically, or mechanically, photochemically and thermochemically.

13. An element according to claims 11 or 12 wherein the reinforced top layer comprises (i) at least one thermoplastic elastomer and (ii) at least one additional polymer wherein the weight ratio of the thermoplastic elastomer to the additional polymer is from 20:1 to 1:2.

14. An element according to claim 13 wherein the top layer comprises the photoinitiated or thermally initiated reaction product of (i) at least one elastomer, (ii) at least one additional polymer, (iii) at least one monomer or oligomer, and (iv) a photoinitiator or thermal initiator wherein the weight ratio of the elastomer to the additional polymer is from 20:1 to 1:2.

15. An element according to claim 11 wherein the intermediate layer comprises the photoinitiated or thermally initiated reaction product of at least one thermoplastic elastomer, at least one monomer or oligomer, a photoinitiator system or thermal initiator system, and the top layer comprises at least one thermoplastic elastomer and at least one additional polymer, wherein the ratio of the thermoplastic elastomer in the top layer to additional polymer in the top layer is in the range from 20:1 to 1:2, said top layer being photohardenable or thermally hardenable due to migration of at least one mobile monomer or oligomer from the intermediate layer to the top layer.

16. An element according to claim 15 wherein the additional polymer is selected from the group consisting of acrylonitrile/butadiene/styrene copolymers, methyl methacrylate/acrylonitrile/butadiene/styrene copolymers, methyl acrylate/acrylonitrile/butadiene/styrene copolymers, and mixtures thereof.

17. An element according to claims 11 or 12 which further comprises (d) a removable coversheet.

18. An element according to claims 11 or 12 wherein at least one laser radiation absorbing component is added.

19. An element according to claim 18 where in the laser radiation absorbing component is carbon black.

20. An element according to claims 11 or 12 wherein said element can be surface detackified either before or after laser engraving.

* * * * *